United States Patent [19]
Johnsen et al.

[11] Patent Number: 5,796,196
[45] Date of Patent: Aug. 18, 1998

[54] ADAPTABLE ROTATING RECTIFIER AND SUPPRESSION RESISTOR ASSEMBLY FOR TWO-POLE, WOUND ROTOR OF DYNAMOELECTRIC MACHINE

[75] Inventors: Tyrone Arthur Johnsen, Rockford; Todd Alan Spierling, Byron; Harry Raymond Carter, Jr., Rockford, all of Ill.

[73] Assignee: Sundstrand Corporation, Rockford, Ill.

[21] Appl. No.: 703,748

[22] Filed: Aug. 26, 1996

[51] Int. Cl.$^6$ .......................... H02K 11/00; F02N 25/08
[52] U.S. Cl. ................ 310/68 D; 310/89; 310/68 R; 310/42; 363/141; 363/145
[58] Field of Search ........................ 310/680, 54, 64, 310/89, 68 R, 42; 363/141, 145

[56] References Cited

U.S. PATENT DOCUMENTS

| | | | |
|---|---|---|---|
| 2,897,383 | 7/1959 | Barrows et al. | 310/68 |
| 4,329,603 | 5/1982 | Ballard | 310/61 |
| 4,581,695 | 4/1986 | Hoppe | 363/145 |
| 4,603,344 | 7/1986 | Trommer | 357/76 |
| 4,628,219 | 12/1986 | Troscinski | 310/68 |
| 4,827,165 | 5/1989 | Nold | 310/68 |
| 4,896,062 | 1/1990 | Pollard | 310/68 |
| 4,959,707 | 9/1990 | Pinchott | 357/76 |
| 5,001,376 | 3/1991 | Iseman | 310/68 |
| 5,003,209 | 3/1991 | Huss et al. | 310/68 |
| 5,006,741 | 4/1991 | Schott | 310/68 |
| 5,065,484 | 11/1991 | Pinchott | 29/25.02 |
| 5,166,564 | 11/1992 | Shahamat et al. | 310/68 |
| 5,191,248 | 3/1993 | Huss | 310/68 |
| 5,344,333 | 9/1994 | Haag | 439/320 |
| 5,587,616 | 12/1996 | Johnsen | 310/68 D |

*Primary Examiner*—Clayton E. LaBalle
*Assistant Examiner*—B Mullins
*Attorney, Agent, or Firm*—Antonelli, Terry, Stout & Kraus

[57] ABSTRACT

An adaptable rotating rectifier and suppression resistor assembly is designed to fit and mate with state-of-the-art, two-pole generators with maximum flexibility to accept a variety of known possible diode configurations and a relatively large suppression resistor in a cost effective manner. A tubular housing of the assembly has an axially extending internal cavity with a plurality of bus bars arranged in fixed, spaced relation in a radially outer portion of the internal cavity so as to extend axially along the internal cavity. A plurality of diodes of any one of at least three significantly different configuration diodes and a suppression resistor are arranged in line along the axis of the internal cavity with radially outwardly extending spring contact plates electrically connecting the diodes and suppression resistor with the bus bars. A desired preload force is provided on these components between an end cap at one end of the housing and a retainer at the other. The end cap is rotationally indexed and constrained with respect to the housing by connections of terminals in the end cap with bus bars.

10 Claims, 6 Drawing Sheets

# ADAPTABLE ROTATING RECTIFIER AND SUPPRESSION RESISTOR ASSEMBLY FOR TWO-POLE, WOUND ROTOR OF DYNAMOELECTRIC MACHINE

FIELD OF INVENTION

The present invention is directed to an improved, adaptable rotating rectifier and suppression resistor assembly for a rotor of a dynamoelectric machine and the method of making the same. More particularly, the plurality of diodes and a suppression resistor are assembled within a tubular housing designed to fit in and mate with state-of-the-art two-pole generators with maximum flexibility to accept a variety of known possible diode configurations and to accept suppression resistors having a resistance down to 50 ohms, all in the most cost effective manner.

BACKGROUND AND SUMMARY OF INVENTION

The current "diode packs" and suppression resistor manifold for the state-of-the-art two-pole generators of aircraft integrated drive generators, are limited in diode space and in suppression resistor thermal capability. These current diode packs were designed for and are limited to use with diodes of a single configuration made by only one company, which has announced its intent and desire to discontinue manufacture and supply. At present there is no alternative supply source for diodes having this configuration. Alternative diodes of different configurations are available from other manufacturers but these do not fit in the existing diode packs. There is a need for an improved, adaptable rotating rectifier and suppression resistor assembly for the rotor of a dynamoelectric machine which can accommodate diodes having any one of a plurality of significantly different configurations so as to avoid the draw back of a single supply source and the necessity of having to redesign the assembly for each of these different configuration diodes.

The wire wound suppression resistor in the current manifold and derivatives thereof are restricted in size and, thus, limited to an approximately 100 ohm value. The higher main field voltage of more recent aircraft has taxed and possibly exceeded these resistors' thermal capability. Similarly, reducing the resistor toward a desired 50 ohms value for enhanced suppression capability over taxes the thermal capability of the current design. There is a need for an improved, adaptable assembly for accommodating and more effectively cooling resistors having resistance values in the range of 50 to 100 ohms with large surface areas for sufficient thermal capability.

An object of the present invention is to provide an improved, adaptable rotating rectifier and suppression resistor assembly for a rotor of a dynamoelectric machine and a method of making the same which overcome the aforementioned drawbacks and disadvantages of the current "diode packs" and manifolds and the related methods of making them. More specifically, an object of the invention is to provide an improved, adaptable rotating rectifier and suppression resistor assembly which can accommodate any one of a plurality of significantly different configuration diodes as the diodes of the assembly and a relatively large suppression resistor down to 50 ohms value in an assembly designed to fit in and mate with state-of-the-art two-pole generators, all in the most cost effective manner.

These and other objects of the invention are attained by the improved, adaptable rotating rectifier and suppression resistor assembly for a rotor of a dynamoelectric machine, according to the invention, the assembly comprising a tubular housing having an axially extending internal cavity, a plurality of bus bars arranged in fixed, spaced relation in a radially outer portion of the internal cavity so as to extend axially along the internal cavity, and a plurality of diodes and a suppression resistor arranged in line along the axis of the internal cavity with radially outwardly extending spring contact plates electrically connecting the diodes and suppression resistor with the bus bars.

An end cap at one end of the internal cavity of the tubular housing is rotatably connected, bayonet style, to the tubular housing by means of a twist lock connection of cooperating tabs on the end cap and grooves in the adjacent end of the housing. The end cap has electrical terminals extending therethrough. Respective ones of the bus bars are connected to the terminals of the end cap for making electrical connections with the assembly and for rotationally indexing, e.g. positioning, and constraining the end cap on the tubular housing of the assembly in the locked position of the twist lock connection.

In the disclosed, preferred embodiments the axial length of the internal cavity of the housing is sufficient to accommodate any one of at least three significantly different configuration diodes having different axial lengths as the plurality of diodes of the assembly, and a relatively large suppression resistor, placed in line along the axis of the internal cavity. A selected one of several different spacers having different axial lengths is arranged in line with the diodes and resistor in the internal cavity as a function of the configuration of the diodes so that the axial length of the in line diodes, resistor and spacer can be contained within the internal cavity.

The assembly further comprises means providing a desired axially directed preload force on the diodes, suppression resistor and spacer in the internal cavity. In the disclosed embodiment this means includes a spring, a plurality of shims for obtaining the desired preload, and a retainer which is connected to the tubular housing at an end thereof opposite the end cap by means of a twist lock connection.

Locator members are provided for radially locating the diodes in the internal cavity. The diode locator members are a selected one of at least three different configuration diode locator members for radially locating respective ones of the at least three significantly different configuration diodes.

The suppression resistor of the assembly is preferably a molded one-piece ceramic resistor having a passage extending therethrough along the axis of the assembly. Fluid passage means provided in the assembly circulate a liquid coolant through the assembly. The liquid coolant is directed to both the outer surface and to the passage in the resistor for maximum surface area and cooling the same. A wire wound resistor can also be employed as the suppression resistor.

A preferred method of the invention for making an adaptable rotating rectifier and suppression resistor assembly for a rotor of a dynamoelectric machine, particularly a two-pole generator of integrated drive generator of an aircraft, comprises the steps of providing a tubular housing having an axially extending internal cavity open at both ends thereof, an internal surface of the tubular housing defining the internal cavity having a plurality of axially extending grooves therein for accommodating respective ones of a plurality of axially extending bus bars. An end cap for one end of the internal cavity is rotatably connected to the tubular housing.

The end cap has electrical terminals extending therethrough. Respective ones of a plurality of bus bars arranged in the grooves in the tubular housing are connected with the terminals for rotationally indexing and constraining the end cap and the tubular housing and for making electrical connections in the assembly. A desired axial preload force is applied on the plurality of diodes and the suppression resistor arranged in line along the axis of the internal cavity with radially outwardly extending spring contact plates electrically connecting the diodes and the suppression resistor with the bus bar.

The step of applying the desired axial preload force includes gauging the length of the components arranged in line along the axis of the internal cavity in the tubular housing after the end cap has been connected to the housing and the diodes, resistor, spring contact plates, locator members and appropriate spacer have been inserted into the housing. A plurality of shims are inserted to finely adjust the length of the stacked components, and a retainer is connected to the end of the housing opposite the end cap with a spring being located intermediate the retainer and the in line arrangement of components for applying the desired axial preload force. The retainer is also preferably connected to the tubular housing by a twist lock connection such that its axial position when in the lock position of the connection is known for predictably loading of the spring.

Thus, the present invention provides an improved, adaptable rotating rectifier and suppression resistor assembly for a rotor of a dynamoelectric machine which is designed in its external dimensions to fit in and mate with state-of-the-art two-pole generators while having maximum flexibility to accept a variety of known possible diode configurations and to accept suppression resistors down to 50 ohms, all in a cost effective manner. That is, the invention permits use of a variety of diode and resistor configurations with only a minor change in radial locating and axial length components of the assembly. The preferred method of obtaining the desired preload force via shims reduces assembly time, cost, complexity and possibility of error.

These and other objects, features and advantages of the present invention will become more apparent from the following detailed description of several embodiments of the present invention taken in connection with the accompanying drawings.

DETAILED DESCRIPTION OF DISCLOSED EMBODIMENTS

Figure 1:
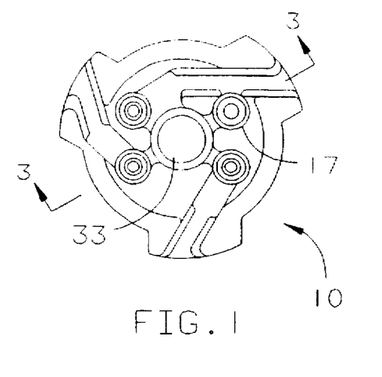
FIG. 1 is an external, exciter connection, end view of an adaptable rotating rectifier and suppression resistor assembly according to the invention taken from the left side of the assembly as shown in FIG. 5.
Figure 2:
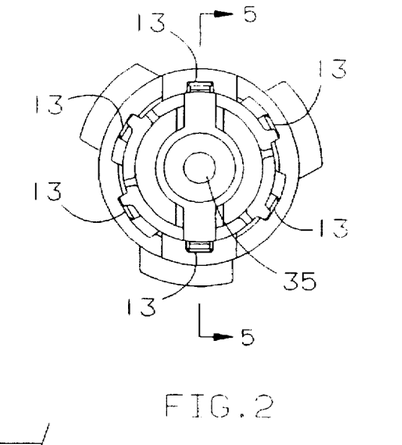
FIG. 2 is a main field connection, end view taken from the right side of the assembly shown in FIG. 5.

Referring now to the drawings, an adaptable rotating rectifier and suppression resistor assembly 10 according to the invention is for a rotor of a dynamoelectric machine, particularly a two-pole generator of an aircraft integrated drive generator. The assembly of the embodiment of FIGS. 1–6 comprises a tubular housing 11 having an internal cavity 12 extending along the longitudinal axis A—A as shown in FIG. 5. Six bus bars 13 are arranged in fixed, equally spaced relation in axially extending grooves 14 in a radially outer portion of the internal cavity so as to extend axially along the cavity. Three of these bus bars are for electrical connection with terminals 15 in an end cap 16 of the assembly for connection with the exciter. A fourth bus bar is connected with a counterweight terminal 17 in the end cap. The other two bus bars extend out through the opposite end of the assembly for connection with the main field, see FIGS. 2 and 4.

A plurality of diodes 18 and a suppression resistor 19 are placed in line along the axis A—A of the internal cavity with radially outwardly extending spring contact plates 20 electrically connecting the diodes and suppression resistor with the bus bars. An end cap 16 is positioned at one end of the internal cavity of the tubular housing. It is rotatably connected to the tubular housing by twist lock connection 30, see FIGS. 5 and 6 formed by tabs in the end cap and cooperating grooves in the tubular housing. The electrical terminals 15 extend axially through the end cap 16. Four of the bus bars are connected to respective ones of the exciter connection terminals after the end cap has been rotatably connected with the tubular housing in the locked position of the twist lock connection by inserting the end cap in the housing cavity and relatively rotating the end cap and housing to a position for connection of the four bus bars to the respective terminals. This position corresponds to a locked position of the twist lock connection, e.g. where the end cap is axially retained on the housing.

Figure 3:
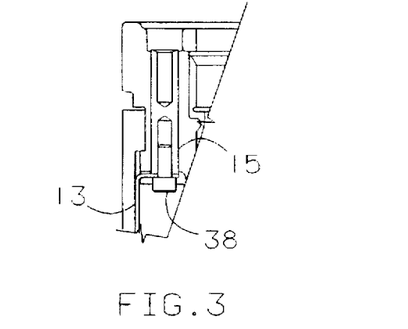
FIG. 3 is a sectional view through a portion of the assembly taken along the section line III—III in FIG. 1.

These electrical connections and the connection of the dummy bus bar to the counterweight terminal rotationally index and constrain the end cap and tubular housing with the end cap in this locked position of the twist lock connection once these connections have been made using suitable threaded fasteners 38 as shown in FIG. 3. This advantageously permits the axial length of the internal cavity to be sufficient to accommodate any one of at least three significantly different configuration diodes and a relatively large suppression resistor placed in line along the axis of the internal cavity while quickly and accurately securing the end cap to the housing without having to integrally mold the tubular housing with an end. The external dimensions of the assembly are such that the assembly fits within the conventional rotor.

A selected one of several different spacers 21–23, see FIGS. 5 and 7–9, in this case spacer 21 is arranged in line with the diodes and resistor in the internal cavity as a function of the configuration of the diodes so that the axial length of the in line diodes, resistor and spacer can be contained within the internal cavity of the same tubular housing. The end 37 of the spacer is in the form of a pivot. A seat 36 is located between the spacer and resistor. A desired axially directed preload force is provided on the diodes, suppression resistor and spacer in the internal cavity by way of a Bellville spring 24, a plurality of shims 25 and a retainer 26 connected to the tubular housing at an end thereof opposite the end cap, by a twist lock connection 31. A spacer 40 is also located between the end cap and the adjacent diode contact plate 20 in this and the other embodiments.

Diode locator members 27 and a resistor locator member 28 for radially locating the diodes and resistor are also provided in the internal cavity. The diode locator members and resistor locator member are selected from a plurality of different configurations corresponding to respective ones of the different configuration diodes and suppression resistors that may be selected for use in the assembly.

Figure 9:
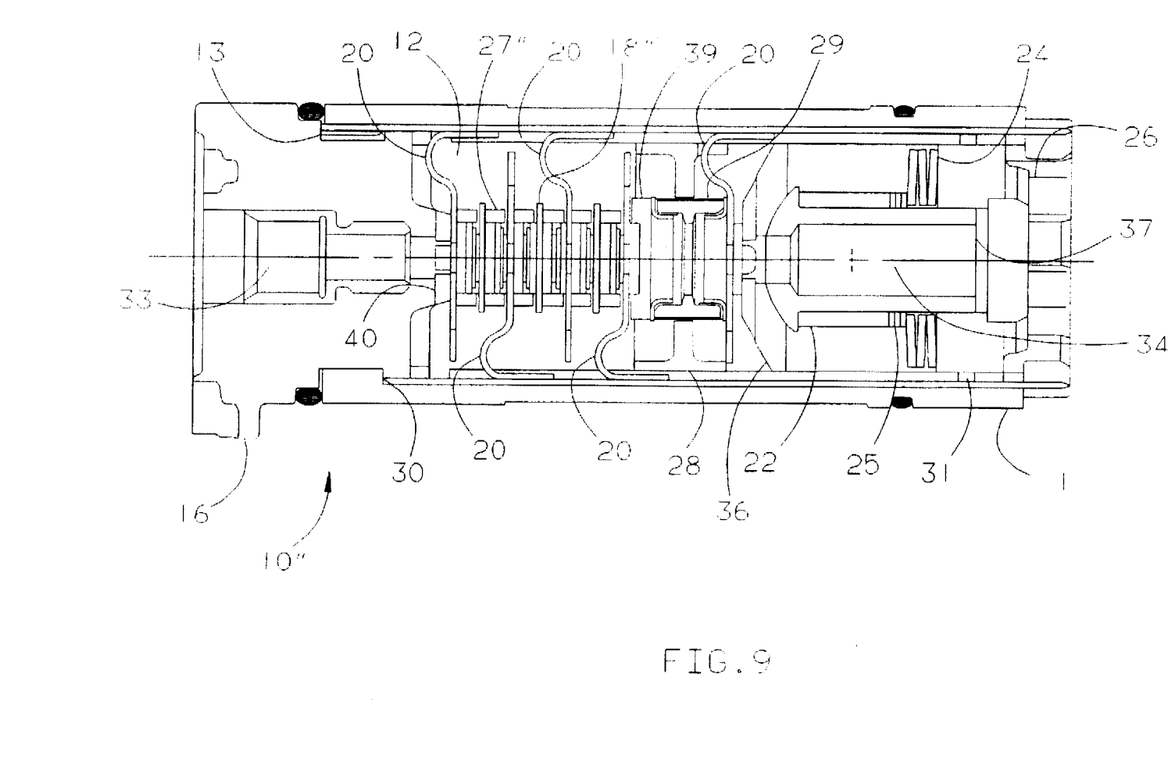
FIG. 9 is a sectional view similar to that in FIG. 8 except that a wire wound suppression resistor is employed rather than a one-piece molded ceramic resistor as in the previous embodiments.

The suppression resistor 19 in one form of the invention is a molded, one-piece ceramic resistor having a passage 32 extending therethrough along the axis A—A of the tubular housing, see the embodiments of FIGS. 5 and 7–9. A liquid coolant, typically oil, is circulated through the assembly from one end to the other by way of axially directed passages 33, 34 and 35 in the end cap, spacer and retainer for cooling the resistor and diodes. Liquid coolant is directed to the passage 32 in the resistor for improved cooling of the resistor. In another form of the invention, as depicted in FIG. 9, the suppression resistor 29 is a wire wound resistor of NiCr, for example. The resistors can have a resistance value in the range of 50 to 100 ohms, for example, with large surface areas for sufficient thermal capability. A resistor seat 39 is employed in the embodiments of FIGS. 7–9.

From the above, it can be seen that the method of making the adaptable rotating rectifier and suppression resistor assembly of the invention comprises providing a tubular housing having an axially extending internal cavity open at both ends thereof, an internal surface of the housing defining the internal cavity have a plurality of axially extending grooves for accommodating respective ones of a plurality of bus bars. The end cap for one end of the internal cavity is rotatably connected with the tubular housing by a twist lock connection with the end cap and tubular housing being rotationally indexed and constrained by connections of the bus bars to terminals in the end cap.

Figure 4:
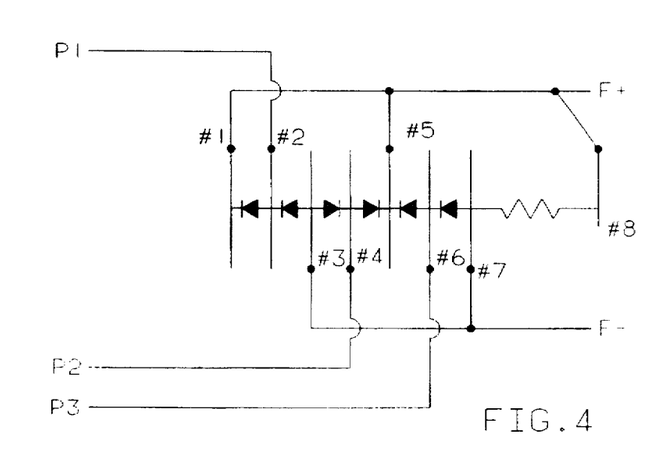
FIG. 4 is a electrical schematic diagram of the adaptable rotating rectifier and suppression resistor assembly of the embodiment of FIGS. 1–6.
Figure 5:
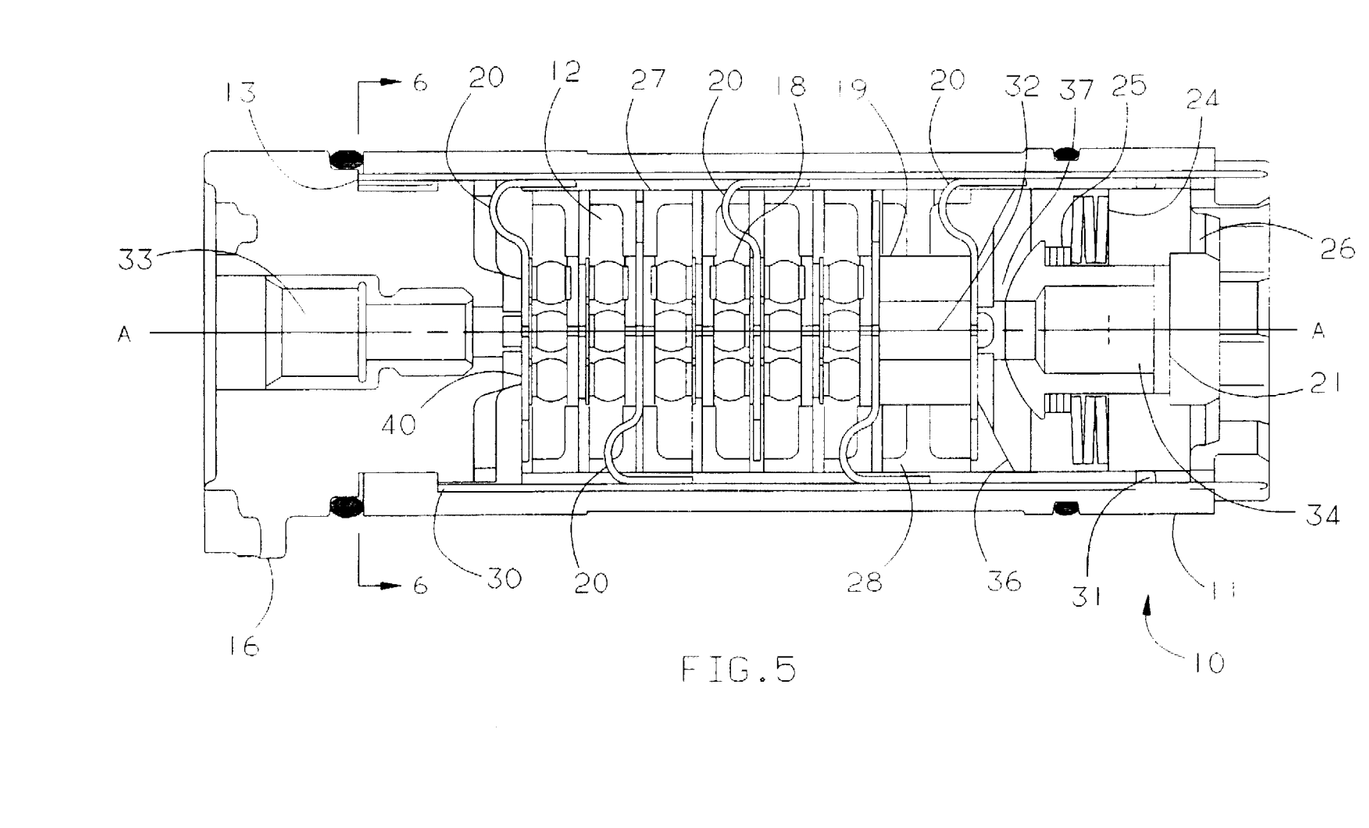
FIG. 5 is a sectional view through an adaptable rotating rectifier and suppression resistor assembly according to a first embodiment of the invention taken along the line V—V in FIG. 2.
Figure 6:
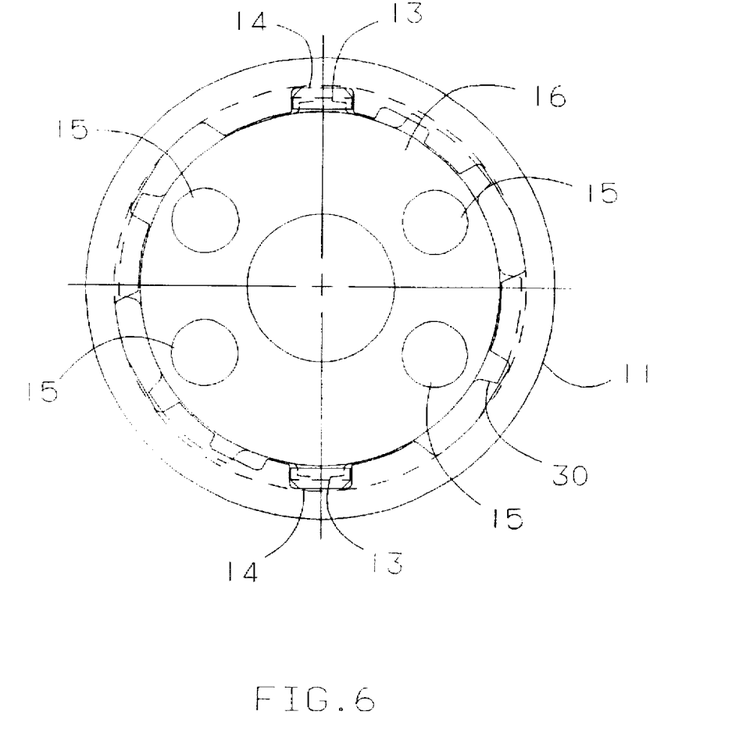
FIG. 6 is an enlarged, sectional view through the tubular housing and end cap illustrating the twist lock connection therebetween taken along the line VI—VI in FIG. 5.
Figure 7:
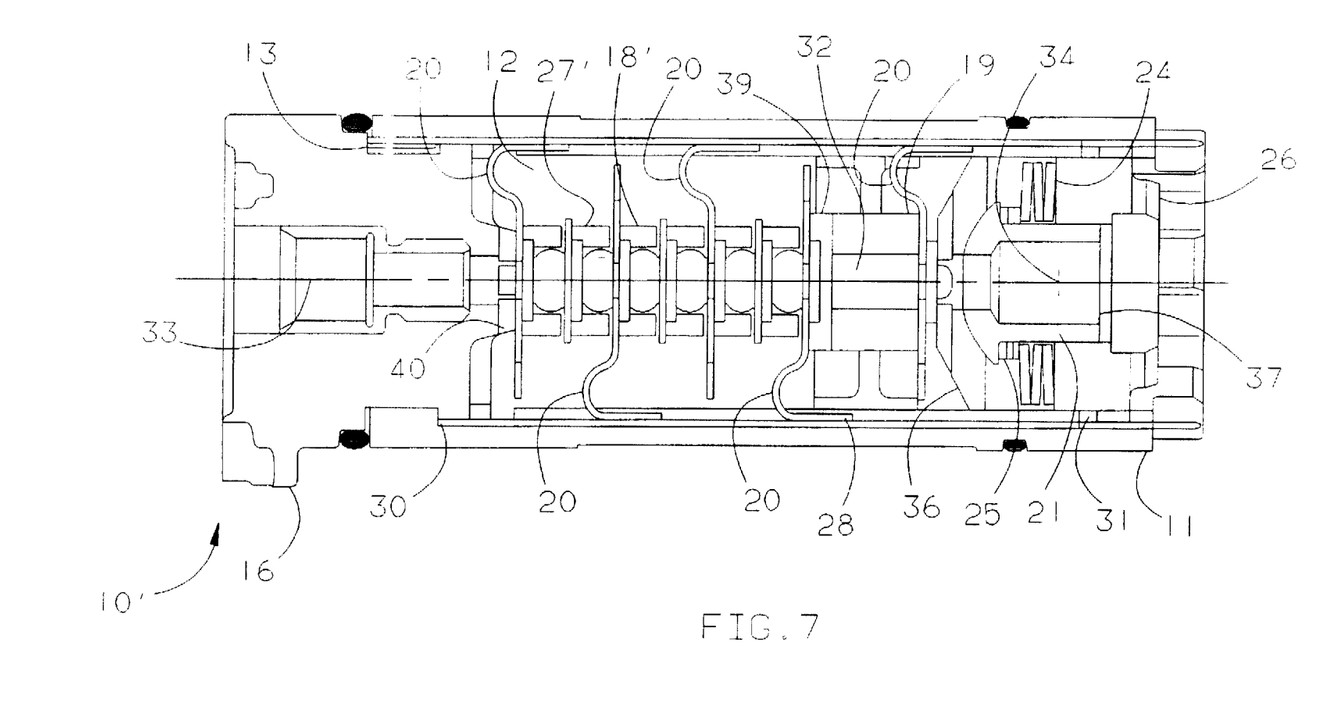
FIG. 7 is a sectional view taken along the logitudinal central axis of another assembly of the invention like that in FIGS. 1–6 but with a different configuration of diodes.
Figure 8:
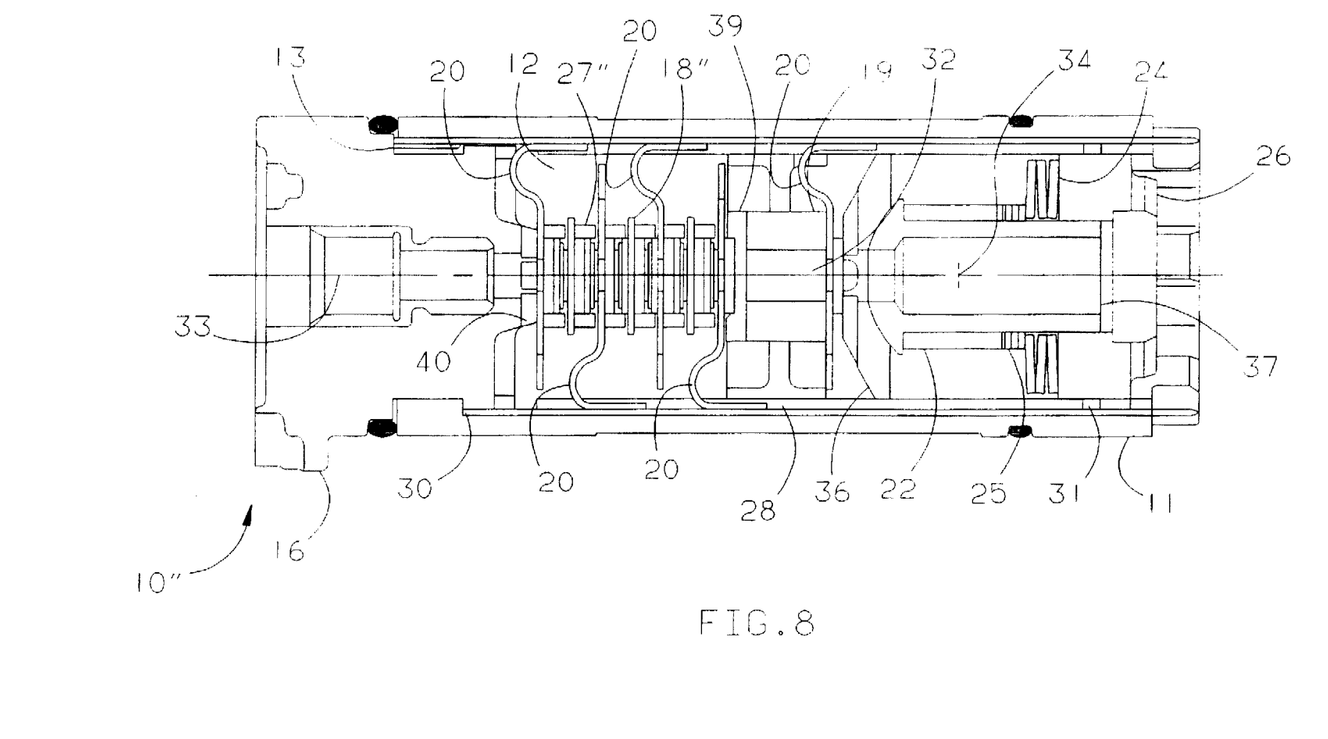
FIG. 8 is a sectional view through a further assembly of the invention similar to the other embodiments but accommodating significantly different configuration diodes and a different spacer having a different axial length.

The diodes, suppression resistor and radially outwardly extending contact plates are assembled in line in the internal cavity with the spring contact plates electrically connecting the diodes and suppression resistor with the bus bars according to the electrical schematic diagram in FIG. 4. A desired preload force is applied to the plurality of diodes and suppression resistor as well as the spring contact plates by way of the spacer, Bellville spring and retainer at the end of the tubular housing opposite the end cap.

The preferred method of obtaining the desired preload force is via shims. That is, before applying the force by connecting the retainer 26 to the tubular housing 11 with the Bellville spring 24 intermediate the selected spacer and the retainer, the height of the in line components in the tubular housing, including the spacer, is determined directly through the use of an assembly gauge with direct readout. The plurality of shims 25 are selected to have the correct height for obtaining the desired compression of the spring and the desired clamping force when the retainer is connected to the housing. This preferred approach reduces assembly time, cost, complexity and possibility of error while permitting use of any one of a plurality of different diode configurations and resistors with only changes in the radial locating members and the spacer of the assembly.

Thus, the improved, adaptable assembly of the present invention includes a single assembly of the diode pack and suppression resistor in lieu of a separate resistor manifold assembly and diode assembly as in the aforementioned known assembly. Nevertheless, the assembly of the invention has external dimensions designed to fit in and mate with state-of-the-art, two-pole generators with maximum flexibility to accept a wide variety of known possible diode configurations and to accept suppression resistors having a resistance down to 50 ohms, all in a cost effective manner. Electrical connection points between the assembly and the exciter and the main field of the generator are also compatible with the existing two-pole generators.

The assembly of the present invention can accommodate a conventional, NiCr wire wound resistor, but it has been found that a molded one-piece, ceramic resistor offers a substantial cost reduction due to the elimination of the winding and termination labor. Both types of resistors are sized to permit resistance values in the range of 50 to 100 ohms with large surface areas for sufficient thermal capability. The diode and resistor electrical connections and their axial restraint are accomplished by the Bellville spring washer and the twist lock arrangement of both the end cap and the retainer at respective ends of the internal cavity, the assembly being formed in bayonet fashion by means of the twist lock connections.

The disclosed embodiments of the invention employ a six bus bar arrangement, one of them being a dummy bus bar as a counter balance as noted above. As an alternative, only five bus bars could be used, two main field bus bars and three exciter bus bars, thus eliminating the sixth bar shown in the illustrated embodiments. The transverse layout of such a five bus bar arrangement would be the two field bus bars 180° apart and the three exciter bus bars 120° apart with one exciter bus bar 90° from each of the two field bus bars.

The planar configuration of the diode plates in such an assembly would require rotational adjustment of their four outer diameter protrusions, e.g. 90° apart and two 45° from the bus bar spring contact leg, to preclude electrical short circuiting with the other bus bars. This arrangement eliminates one bus bar, screw, and terminal and their associated cost and weight while producing a more naturally balanced arrangement.

While we have shown and described several embodiments in accordance with the present invention, it is understood that the same is not limited thereto but is susceptible to numerous changes and modifications as will be readily apparent to the skilled artisan. Therefore, we do not wish to be limited to the details of the embodiments disclosed herein but by the scope of the appended claims.

We claim:

1. An adaptable rotating rectifier and suppression resistor assembly for a rotor of a dynamoelectric machine, said assembly comprising:
 - a tubular housing having an axially extending internal cavity without an integrally formed end at its two opposite ends;
 - a plurality of bus bars arranged in fixed spaced relation in a radially outer portion of said internal cavity so as to extend axially along said internal cavity;
 - a plurality of diodes and a suppression resistor placed in line along said axis of said internal cavity with radially outwardly extending spring contact plates electrically connecting said diodes and suppression resistor with said bus bars;

an end cap at a first of said two opposite ends of said internal cavity of said tubular housing, said end cap being rotatably connected to said tubular housing and having electrical terminals extending therethrough, respective ones of said bus bars being connected to said terminals for making electrical connections with said assembly and for rotationally positioning and constraining said end cap with respect to said tubular housing, said end cap and said tubular housing being rotatably connected by a twist lock connection therebetween, said electrical connections of said bus bars and terminals of said end cap rotationally positioned with respect to said end cap so that said end cap is constrained in a locked position of said twist lock connection for securing said end cap on said tubular housing; and a retainer connected to said tubular housing at a second end thereof of said two opposite ends.

2. The assembly according to claim 1, wherein the axial length of said internal cavity is sufficient to accommodate any one of at least three significantly different configuration diodes having different axial lengths as said plurality of diodes and a relatively large suppression resistor placed in line along said axis of said internal cavity.

3. The assembly according to claim 2, further comprising a selected one of several different spacers having different axial lengths arranged in line with said diodes and resistor in said internal cavity, the length of said spacer being selected as a function of the axial length of said diodes so that the axial length of the in line diodes, resistor and spacer can be contained within said internal cavity.

4. The assembly according to claim 3, further comprising means providing a desired axially directed preload force on said diodes, suppression resistor and spacer in said internal cavity.

5. The assembly according to claim 4, wherein said means includes a spring and a plurality of shims between said spring and said spacer for obtaining said desired preload.

6. The assembly according to claim 5, wherein said retainer is connected to said tubular housing by a twist lock connection therebetween.

7. The assembly according to claim 2, further comprising diode locator members for radially locating said diodes in said internal cavity, said diode locator members being a selected one of at least three different configuration diode locator members for radially locating respective ones of said at least three significantly different configuration diodes.

8. The assembly according to claim 1, wherein said suppression resistor is a molded, one-piece ceramic resistor having a passage extending therethrough along said axis, and wherein fluid passage means are provided in said assembly for circulating a liquid coolant therethrough, said liquid coolant being directed to said passage in said resistor for cooling the same.

9. The assembly according to claim 1, wherein said suppression resistor is a wire wound resistor.

10. The assembly according to claim 1, wherein said bus bars extend in axially directed grooves on an inner surface of said tubular housing defining said internal cavity.

* * * * *